United States Patent
Fujiwara et al.

(10) Patent No.: US 10,149,408 B2
(45) Date of Patent: Dec. 4, 2018

(54) LIQUID IMMERSION BATH FOR ELECTRONIC DEVICE

(71) Applicant: FUJITSU LIMITED, Kawasaki-shi, Kanagawa (JP)

(72) Inventors: Shinnosuke Fujiwara, Kawasaki (JP); Hideo Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/611,067

(22) Filed: Jun. 1, 2017

(65) Prior Publication Data

US 2018/0020570 A1    Jan. 18, 2018

(30) Foreign Application Priority Data

Jul. 14, 2016    (JP) .................. 2016-139297

(51) Int. Cl.
    *H05K 7/20*     (2006.01)
    *H05K 5/06*     (2006.01)
    *H01L 23/44*    (2006.01)

(52) U.S. Cl.
    CPC ............ *H05K 7/203* (2013.01); *H05K 5/068* (2013.01); *H05K 7/20* (2013.01); *H05K 7/208* (2013.01); *H05K 7/20318* (2013.01); *H05K 7/20327* (2013.01); *H05K 7/20418* (2013.01); *H01L 23/44* (2013.01)

(58) Field of Classification Search
    None
    See application file for complete search history.

(56) References Cited

U.S. PATENT DOCUMENTS

| 4,590,538 A | 5/1986 | Cray et al. |
| 2013/0105122 A1* | 5/2013 | Campbell ............. H05K 7/203 165/104.26 |
| 2015/0109735 A1* | 4/2015 | Campbell .......... H05K 7/20318 361/700 |
| 2017/0303434 A1* | 10/2017 | Katsumata ............. H01L 23/44 |

FOREIGN PATENT DOCUMENTS

| JP | 59-145548 | 8/1984 |
| JP | 60-1852 A | 1/1985 |
| JP | 61-59395 | 4/1986 |
| JP | 2-67792 A | 3/1990 |

(Continued)

OTHER PUBLICATIONS

Japanese Office Action dated Dec. 19, 2017 for corresponding Japanese Patent Application No. 2016-139297, with English Translation, 10 pages.

*Primary Examiner* — Dimary Lopez Cruz
*Assistant Examiner* — Zhengfu Feng
(74) *Attorney, Agent, or Firm* — Fujitsu Patent Center

(57) ABSTRACT

A liquid immersion bath for an electronic device includes: a bath body that is capable of housing the electronic device, is coupled to a circulation path through which a liquid coolant which cools the electronic device immersed in the liquid coolant circulates, and includes a gas phase portion corresponding to a space free from the liquid coolant; and a container that is disposed in the gas phase portion and has a volume which changes in accordance with a pressure of the gas phase portion, wherein an inside of the container is coupled to an outside of the bath body.

16 Claims, 22 Drawing Sheets

(56) References Cited

FOREIGN PATENT DOCUMENTS

| | | | |
|---|---|---|---|
| JP | 3-91948 | | 4/1991 |
| JP | 3-229493 | A | 10/1991 |
| JP | 4-3451 | | 1/1992 |
| JP | 04003451 | A * | 1/1992 |
| JP | 4-42749 | | 2/1992 |
| JP | 5-95064 | A | 4/1993 |
| JP | 7-15151 | A | 1/1995 |
| JP | 07015151 | A * | 1/1995 |

* cited by examiner

LIQUID IMMERSION BATH FOR ELECTRONIC DEVICE

CROSS-REFERENCE TO RELATED APPLICATION

This application is based upon and claims the benefit of priority of the prior Japanese Patent Application No. 2016-139297, filed on Jul. 14, 2016, the entire contents of which are incorporated herein by reference.

FIELD

The embodiments discussed herein are related to a liquid immersion bath for an electronic device.

BACKGROUND

Various different types of cooling mechanisms are used in electronic devices.

Related technologies are disclosed in Japanese Laid-open Patent Publication No. 3-91948, Japanese Unexamined Utility Model Registration Application Publication No. 4-42749, Japanese Laid-open Patent Publication No. 59-145548, Japanese Laid-open Patent Publication No. 04-003451, and Japanese Unexamined Utility Model Registration Application Publication No. 61-059395.

SUMMARY

According to an aspect of the embodiments, a liquid immersion bath for an electronic device includes: a bath body that is capable of housing the electronic device, is coupled to a circulation path through which a liquid coolant which cools the electronic device immersed in the liquid coolant circulates, and includes a gas phase portion corresponding to a space free from the liquid coolant; and a container that is disposed in the gas phase portion and has a volume which changes in accordance with a pressure of the gas phase portion, wherein an inside of the container is coupled to an outside of the bath body.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Electronic devices in data centers, such as servers, include a highly densely integrated circuit or highly compactly installed electronic components and process an increased amount of data. Accordingly, the electronic devices increase the amount of heat they produce, so that a more efficient cooling technology may be provided. Examples of a method for cooling an electronic device include a forcedly air-cooling system using a cooling fan and a liquid immersion cooling system in which an electronic device is immersed in a liquid coolant.

Some liquid-cooling coolants in which electronic devices are immersed are relatively expensive. Thus, a technology to hinder coolants from escaping from a system is provided. An example of a measure to hinder a coolant from escaping from the system is to enclose the coolant in a sealed space. For example, a liquid immersion cooling system in which a coolant is not assumed to boil may employ a structure that regulates the pressure change in a system, unlike a cooling system, as in the case of ebullient cooling, in which the internal pressure is assumed to rise naturally.

In order to regulate the pressure change of a coolant enclosed in a sealed space, the liquid immersion cooling system in which a coolant is not assumed to boil may include, for example, a pressure regulating valve, which restricts a rise of the internal pressure. Alternatively, one or more components defining the sealed space may be formed from an extendable material or formed in an extendable mechanism. For example, in the system including a pressure regulating valve, a coolant vapor escapes to the outsize of the system when the pressure regulating valve opens, so that the system fails to hinder the coolant from escaping to the outside of the system. In addition, opening an opening-closing device, such as a lid, may become difficult when the inside of the liquid immersion bath has a negative pressure. When, for example, part of the liquid immersion bath in which an electronic device is to be immersed is formed from an extendable material or formed in an extendable mechanism, an upper portion of the liquid immersion bath is formed from such a material or formed in such a mechanism. This configuration may restrict the design of each portion of the liquid immersion bath due to the presence of an opening-closing device such as a lid.

Figure 1:
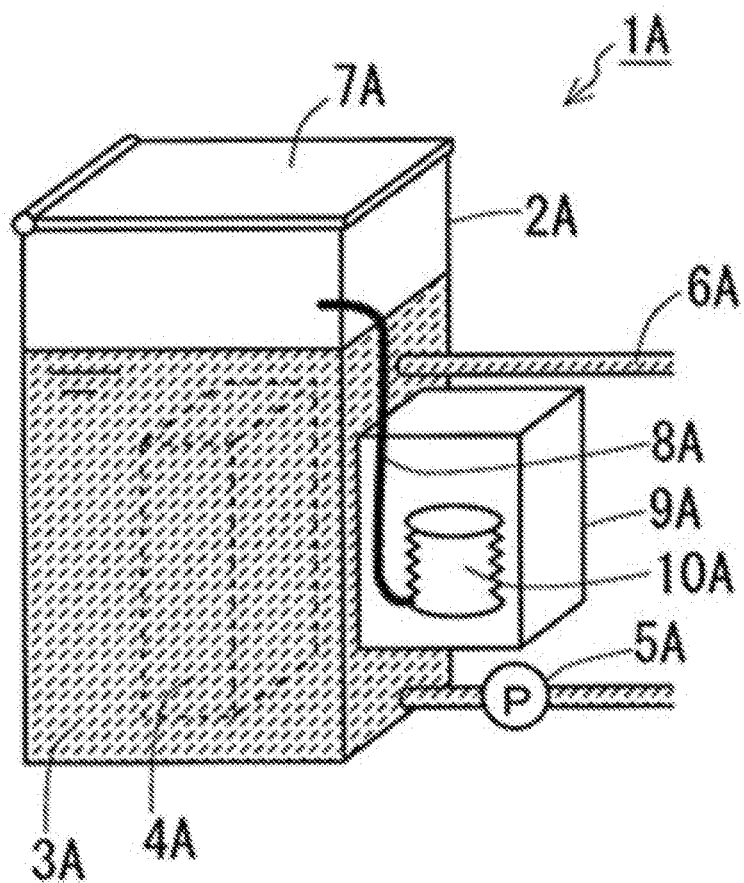
FIG. 1 illustrates an example of a liquid immersion bath for an electronic device.

FIG. 1 illustrates an example of a liquid immersion bath 1A for an electronic device 4A. The liquid immersion bath 1A includes a bath body 2A that holds a liquid coolant 3A. The bath body 2A houses the electronic device 4A immersed in the coolant 3A. The electronic device 4A is an electronic device desirably cooled during its operation. The electronic device 4A may be, for example, a server, a database, a communication device, a medical electronic device, an electronic device for various experimental facilities, or any of other electronic devices for various different purposes. A circulation path 6A equipped with a pump 5A, which forces the coolant 3A to flow into and out of the bath body 2A for circulation in the system, is connected to the bath body 2A. The coolant 3A forced to circulate by the pump 5A circulates through the circulation path 6A.

For easy maintenance of the electronic device 4A, the bath body 2A includes a lid 7A, which renders the electronic device 4A accessible from a gas phase portion. The lid 7A may be a hermetic lid that is capable of rendering the upper portion of the bath body 2A open or closed. The lid 7A is closed while the electronic device 4A is in operation. The liquid immersion bath 1A thus includes a container 10A continuous with the gas phase portion of the bath body 2A in order to reduce a difference in pressure between the inside and the outside of the bath body 2A, the difference in pressure being caused by a change in volume of the coolant 3A in a liquid phase portion, which expands and contracts with heat of the electronic device 4A, an emergence of gas dissolved in the coolant 3A, a dissolution of gas into the coolant 3A, or a change in volume of the gas in a gas phase portion.

The container 10A is a container whose capacity changes in accordance with the pressure of the gas phase portion in the bath body 2A. The container 10A may be, for example, a container that includes flexible bellows capable of expanding and contracting in accordance with a fine pressure difference, a bag-shaped container formed from a flexible material, a cylindrical container in which a piston is slidable in accordance with a pressure difference, or any of other types of containers. The size of the container 10A may be appropriately determined in accordance with the assumed amount of respiration of the gas phase portion, although it depends on various factors such as the amount of the coolant 3A, the type of the coolant 3A, the amount of air or the coolant vapor in the gas phase portion of the bath body 2A, and the size of the gas phase portion of the bath body 2A.

For example, in FIG. 1, the inside of the container 10A is connected to the gas phase portion of the bath body 2A using a tube 8A. Instead of the tube 8A, the container 10A may be connected to the gas phase portion of the bath body 2A using an inflexible pipe. Alternatively, the inside of the container 10A and the gas phase portion of the bath body 2A may be directly connected together. In FIG. 1, the container 10A is housed in an unhermetic box-shaped housing portion 9A fixed to an external surface of the bath body 2A. The container 10A may be located in any of other portions. The tube 8A or another device that connects the inside of the container 10A and the gas phase portion of the bath body 2A to each other may be attached to the container 10A and the bath body 2A by welding, a removable joint such as compression fitting, or any of other devices.

Figure 2A:
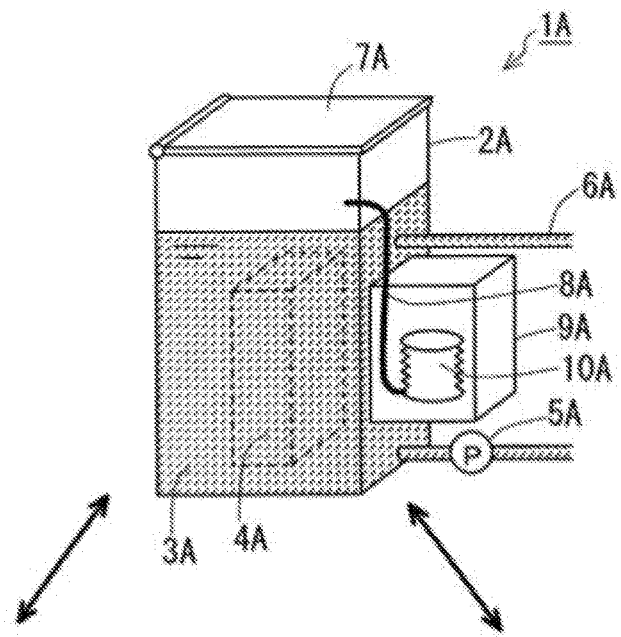
FIG. 2A to FIG. 2C illustrate an example of a container in various states.
Figure 2B:
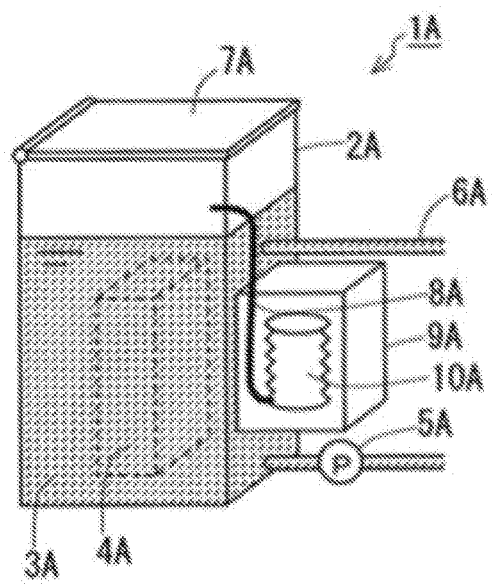
Figure 2C:
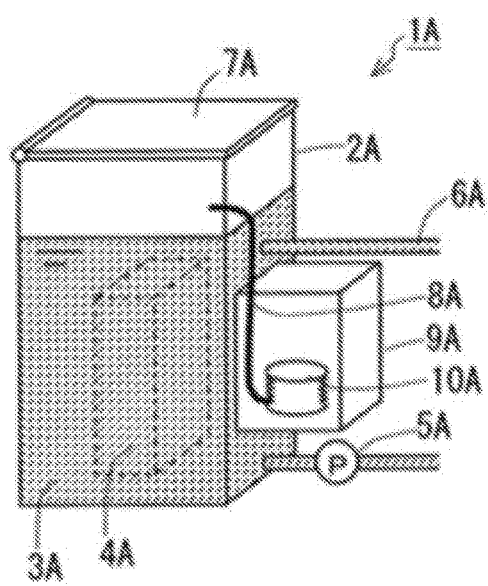

A change of the internal pressure of the liquid immersion bath 1A is restricted. FIG. 2A to FIG. 2C illustrate an example of a container in various different states. The container 10A connected to the gas phase portion of the bath body 2A expands or contacts in accordance with the difference between the pressure inside the gas phase portion of the bath body 2A and the pressure of the outside air. For example, when the temperature inside the bath body 2A rises from that in the case where the container 10A is in the state of FIG. 2A due to, for example, the heat of the electronic device 4A, the volume of the gas in the gas phase portion expands, gas dissolved in the coolant 3A emerges, or the volume of the coolant 3A expands, so that part of gas in the gas phase portion flows out to the container 10A. Thus, the container 10A expands, as illustrated in FIG. 2B. When, for example, the temperature inside the bath body 2A falls from that in the case where the container 10A is in the state of FIG. 2A, the volume of the gas in the gas phase portion contracts, gas is dissolved into the coolant 3A, or the volume of the coolant 3A contracts, so that part of gas inside the container 10A flows out to the liquid immersion bath 1A. Thus, the container 10A contracts, as illustrated in FIG. 2C.

The liquid immersion bath 1A may be a liquid cooling system in which a coolant is not assumed to boil. The liquid immersion bath 1A includes a mechanism in which a heat-dissipating device disposed at a portion of the circulation path 6A dissipates heat while keeping the coolant 3A in a liquid phase. Thus, unlike a cooling system, as in the case of ebullient cooling, in which the internal pressure is assumed to rise naturally, the liquid immersion bath 1A and the circulation path 6A do not have to have pressure resistance not as high as the pressure resistance that the cooling system in which ebullient cooling is assumed is supposed to have. Thus, in the liquid immersion bath 1A, the internal pressure of the liquid immersion bath 1A is kept substantially the same as the atmospheric pressure since the liquid immersion bath 1A includes the container 10A that expands or contracts in accordance with the pressure of the gas phase portion of the bath body 2A although the coolant 3A is enclosed in a sealed space so that the amount of the coolant that escapes to the outside of the system is restricted to a minimum. The liquid immersion bath 1A does not have to have such a high pressure resistance that the liquid immersion bath 1A would be otherwise supposed to have as a result of sealing of the coolant 3A.

The liquid immersion bath 1A is capable of restricting a change of the internal pressure with a simple design. For example, the container 10A may be disposed at any portion of the liquid immersion bath 1A as long as it is apart from the lid 7A, which is opened and closed in order for the electronic device 4A to be accessed from the gas phase portion. This configuration is thus less likely to restrict the design of each component of the liquid immersion bath 1A, such as the position of the lid 7A.

The coolant 3A included in the liquid immersion bath 1A may be an insulating liquid that does not cause a leakage of electricity when it comes into contact with an electrically conductive member and a liquid that does not boil with the heat of the electronic device 4A. The insulating liquid may be a synthetic-oil-based liquid or a carbon-fluoride-based liquid. The coolant 3A may be either a synthetic-oil-based liquid or a carbon-fluoride-based liquid. For example, a synthetic-oil-based liquid has lower volatility and higher viscosity than a carbon-fluoride-based liquid. It is thus difficult to remove a synthetic-oil-based liquid from the electronic device 4A during maintenance of the electronic device 4A. Thus, a carbon-fluoride-based liquid may be more convenient than a synthetic-oil-based liquid. Examples of a carbon-fluoride-based liquid may include "Novec" (registered trademark) and "Fluorinert" (registered trademark), which are the product names from 3M. "Fluorinert", which has a high boiling point and is less likely to boil with the heat of the electronic device 4A, may be more suitable than "Novec".

When the electronic device 4A is cooled by the liquid coolant 3A, the liquid coolant 3A conveys an amount of heat, per unit volume, several hundred times or greater than the amount of heat that gas such as air conveys. This configuration may thus far more efficiently cool a densely populated electronic device than an air-cooling system. Since the heat of the electronic device 4A is conveyed by the liquid coolant 3A, this configuration may dispense with a large air-conditioning system such as a system used in a datacenter or the like. Thus, power consumed by the air-conditioning system may be reduced and noise of, for example, air current resulting from the operation of a fan may be reduced.

Figure 3:
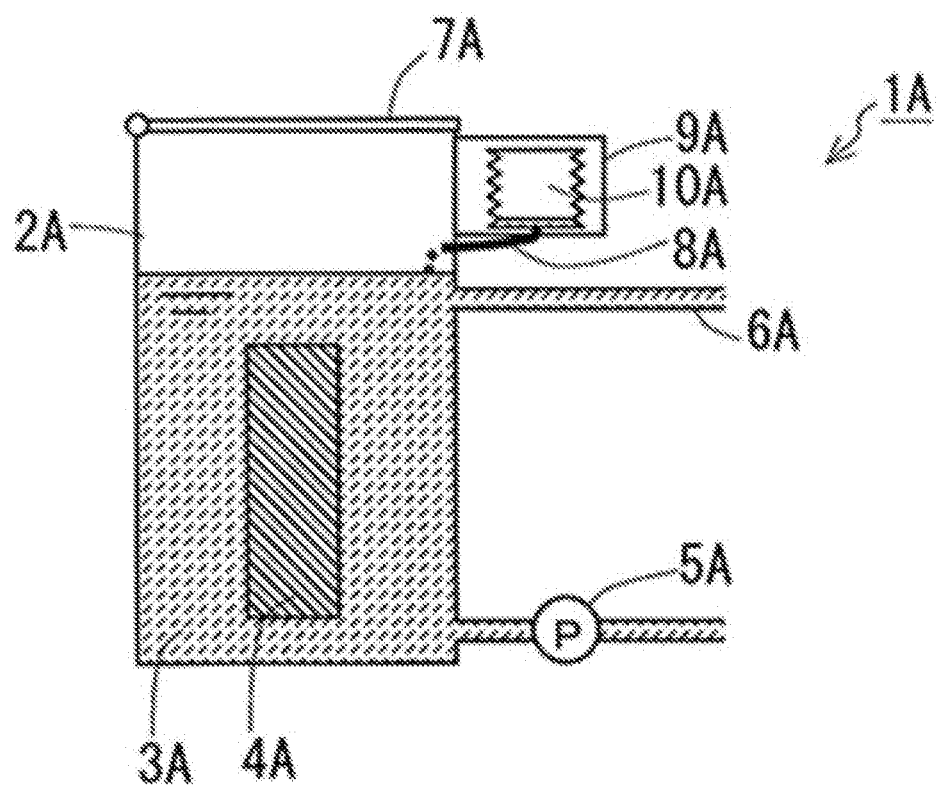
FIG. 3 illustrates an example of a liquid immersion bath.

FIG. 3 illustrates an example of a liquid immersion bath. The liquid immersion bath 1A illustrated in FIG. 1 includes the container 10A at a position lower than the liquid level of the coolant 3A inside the bath body 2A. For example, in the liquid immersion bath 1A illustrated in FIG. 1, the container 10A may be disposed at a position, for example, higher than the liquid level of the coolant 3A inside the bath body 2A, as illustrated in FIG. 3. The tube 8A may be connected to a lower portion of the container 10A and the bath body 2A and the tube 8A may be connected together at the position lower than the position at which the tube 8A and the container 10A are connected. In the liquid immersion bath 1A in which the container 10A is disposed at a position higher than the liquid level of the coolant 3A inside the bath body 2A, in which the tube 8A is connected to a lower portion of the container 10A, and in which the bath body 2A and the tube 8A are connected together at the position lower than the position at which the tube 8A and the container 10A is connected, the coolant 3A accumulated in the container 10A flows down into the bath body 2A through the tube 8A even when a coolant vapor condenses inside the container 10A. This configuration thus may hinder the coolant 3A from accumulating in a bottom portion of the container 10A or in the tube 8A or gas flow between the gas phase portion in the bath body 2A and the container 10A from stagnating.

Figure 4:
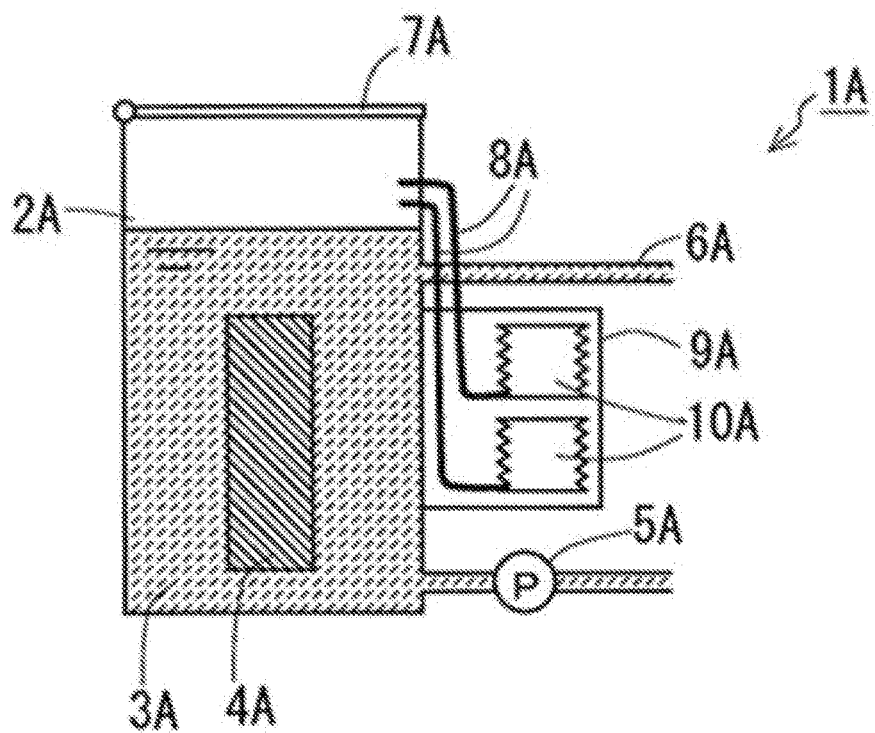
FIG. 4 illustrates an example of a liquid immersion bath.

FIG. 4 illustrates an example of a liquid immersion bath. The liquid immersion bath 1A illustrated in FIG. 1 includes one container 10A. The liquid immersion bath 1A illustrated in FIG. 1 may include, for example, multiple containers 10A, as illustrated in FIG. 4. The number of containers 10A may be appropriately determined in accordance with various factors including the size of each container 10A, the amount of the coolant 3A, the type of the coolant 3A, the amount of air or a coolant vapor in the gas phase portion of the bath body 2A, and the size of the gas phase portion of the bath body 2A.

Figure 5:
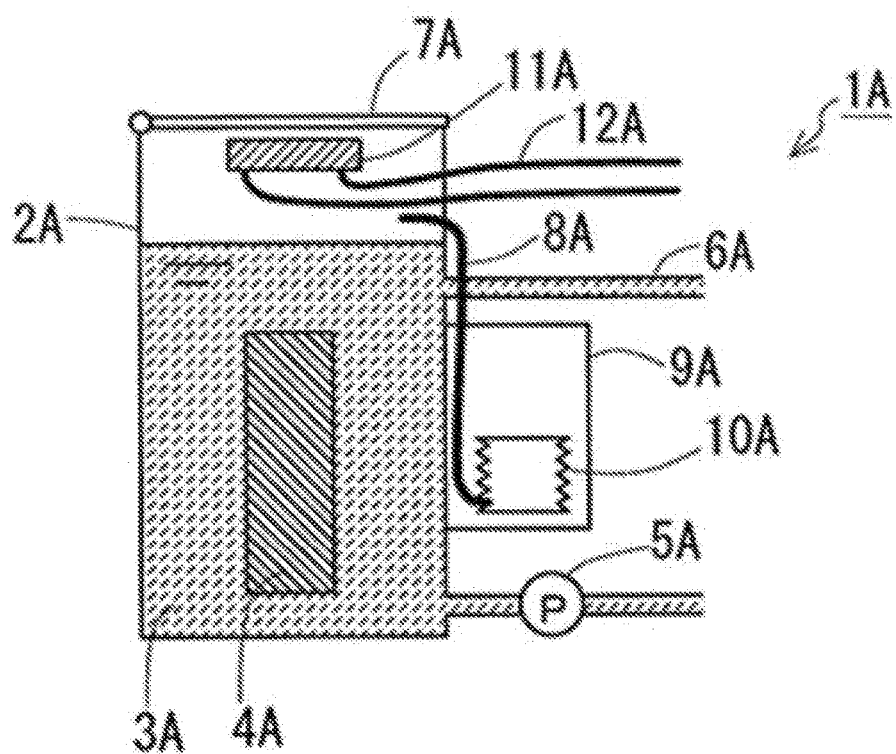
FIG. 5 illustrates an example of a liquid immersion bath.

FIG. 5 illustrates an example of a liquid immersion bath. The liquid immersion bath 1A illustrated in FIG. 1 may include, for example, a cooler 11A in the gas phase portion of the bath body 2A, as illustrated in FIG. 5. For example, a cooling pipe 12A is connected to the cooler 11A. The cooling pipe 12A allows cooling water cooled by a refrigerator, cooling water cooled by a cooling tower, or cooling water of various other types to flow therethrough. When the cooler 11A is disposed in the gas phase portion of the bath body 2A, for example, a coolant that has evaporated with the heat of the electronic device 4A condenses. When the coolant that has evaporated in the gas phase portion of the bath body 2A condenses, the amount of gas in the gas phase portion decreases, so that the rise of the internal pressure of the bath body 2A is reduced. The size of the container 10A may thus be reduced.

Figure 6:
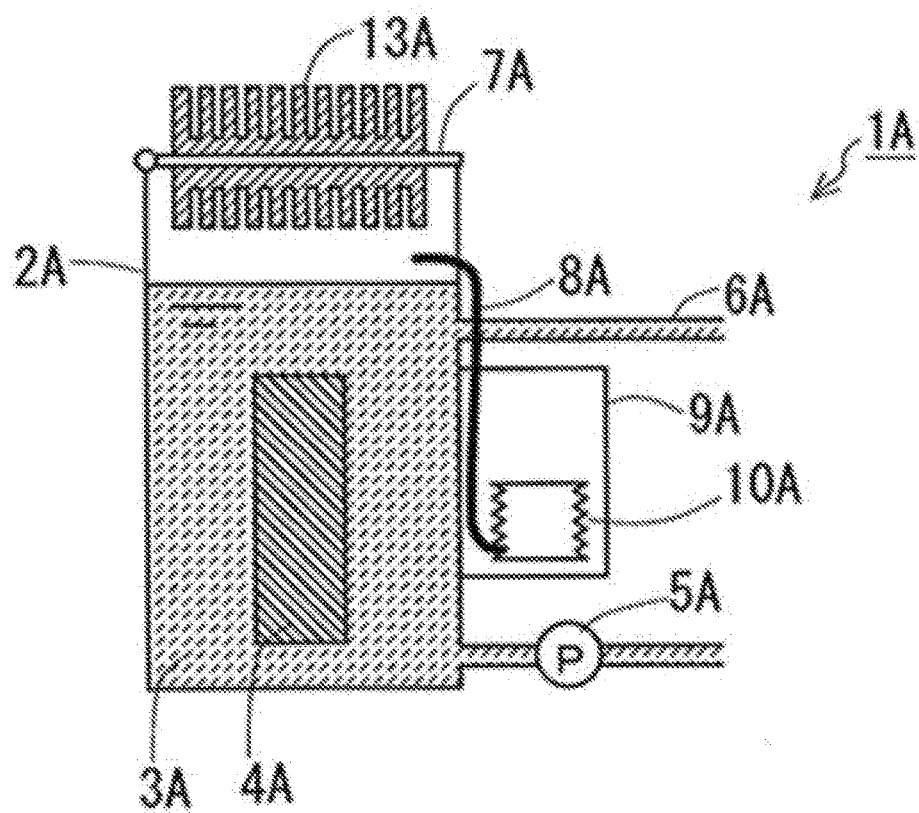
FIG. 6 illustrates an example of a liquid immersion bath.

FIG. 6 illustrates an example of a liquid immersion bath. The liquid immersion bath 1A illustrated in FIG. 1 may include, for example, a radiator 13A, which exchanges heat between the inside and the outside of the bath body 2A, at an upper portion of the bath body 2A, as illustrated in FIG. 6. When the radiator 13A is disposed at an upper portion of the bath body 2A, for example, the coolant that has evaporated with the heat of the electronic device 4A condenses. When the coolant that has evaporated in the gas phase portion of the bath body 2A condenses, the amount of gas in the gas phase portion decreases, so that the rise of the internal pressure of the bath body 2A is reduced. The size of the container 10A may thus be reduced.

Figure 7:
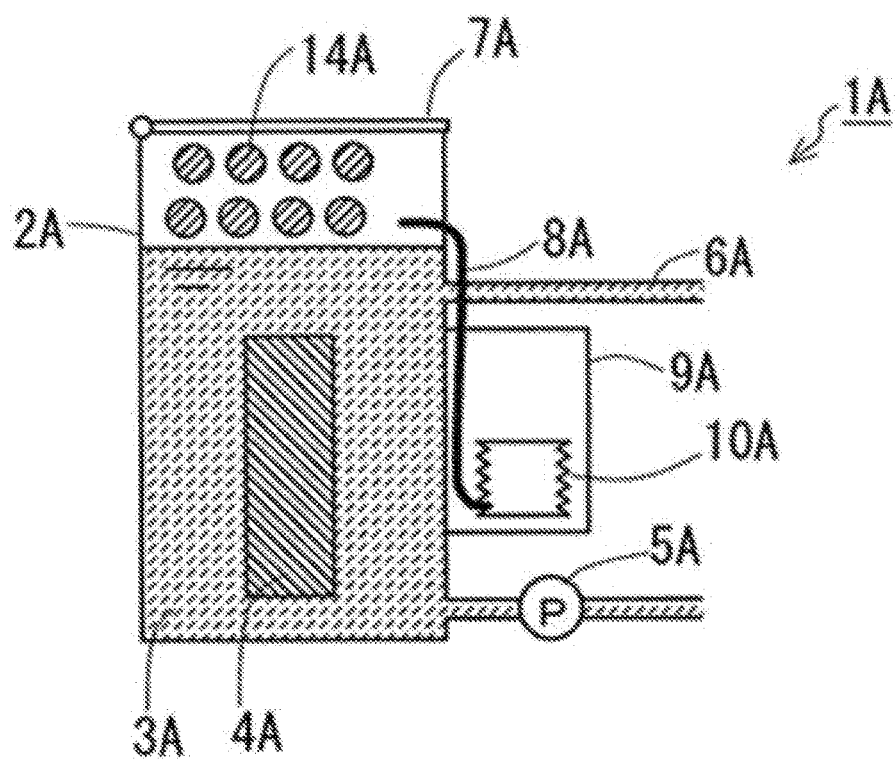
FIG. 7 illustrates an example of a liquid immersion bath.

FIG. 7 illustrates an example of a liquid immersion bath. The liquid immersion bath 1A illustrated in FIG. 1 may include, for example, various objects 14A, which substantially reduce the capacity of the gas phase portion, in the gas phase portion of the bath body 2A, as illustrated in FIG. 7. When the capacity of the gas phase portion of the bath body 2A is reduced by the various objects 14A, the amount by which gas in the gas phase portion expands with heat decreases. The size of the container 10A may thus be reduced.

Figure 8:
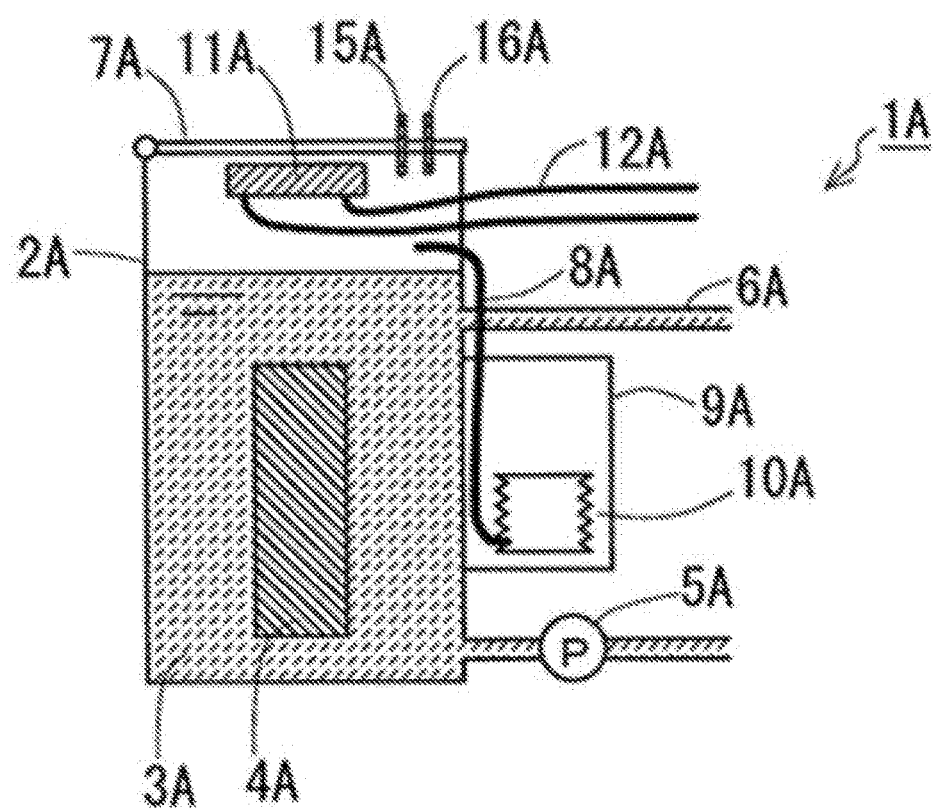
FIG. 8 illustrates an example of a liquid immersion bath.

FIG. 8 illustrates an example of a liquid immersion bath. The liquid immersion bath 1A illustrated in FIG. 1 may include, for example, besides the cooler 11A illustrated in FIG. 5, a thermometer 15A, which measures the temperature of the gas phase portion of the bath body 2A, and a pressure gauge 16A, which measures the pressure of the gas phase portion of the bath body 2A. For example, a cooling pipe 12A, through which cooling water whose temperature has been adjusted in accordance with the temperature measured by the thermometer 15A or the pressure measured by the pressure gauge 16A flows, is connected to the cooler 11A. When the temperature of cooling water that flows through the cooler 11A is adjusted in accordance with the temperature measured by the thermometer 15A or the pressure measured by the pressure gauge 16A, the amount by which the coolant that has evaporated in the gas phase portion condenses may be adjusted.

Figure 9:
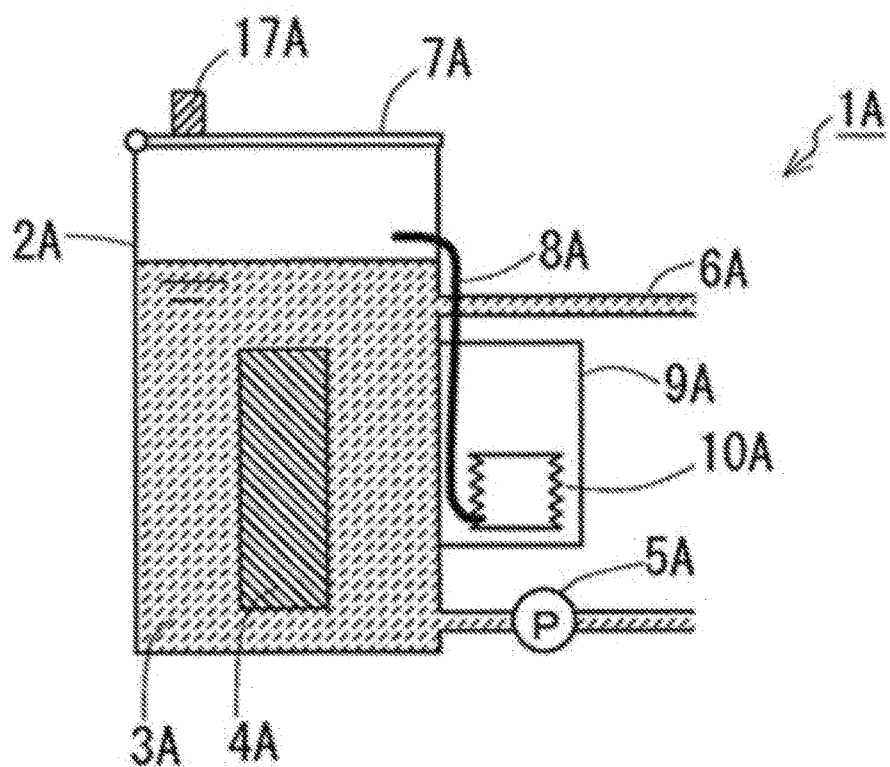
FIG. 9 illustrates an example of a liquid immersion bath.

FIG. 9 illustrates an example of a liquid immersion bath. The liquid immersion bath 1A illustrated in FIG. 1 may include, for example, a pressure regulating valve 17A, which opens when the pressure of the gas phase portion of the bath body 2A arrives at a predetermined pressure, as illustrated in FIG. 9. The pressure at which the pressure regulating valve 17A opens may be lower than a lower one of the resistible pressure of the bath body 2A and the resistible pressure of the container 10A. In the case where, for example, the liquid immersion bath 1A includes the pressure regulating valve 17A that functions as a safety valve, the pressure regulating valve 17A opens, for example, when the pressure of the gas phase portion of the bath body 2A is to rise beyond the limit of the pressure range within which the container 10A is expansible. Thus, the bath body 2A or the container 10A may be less likely to be broken.

Figure 10:
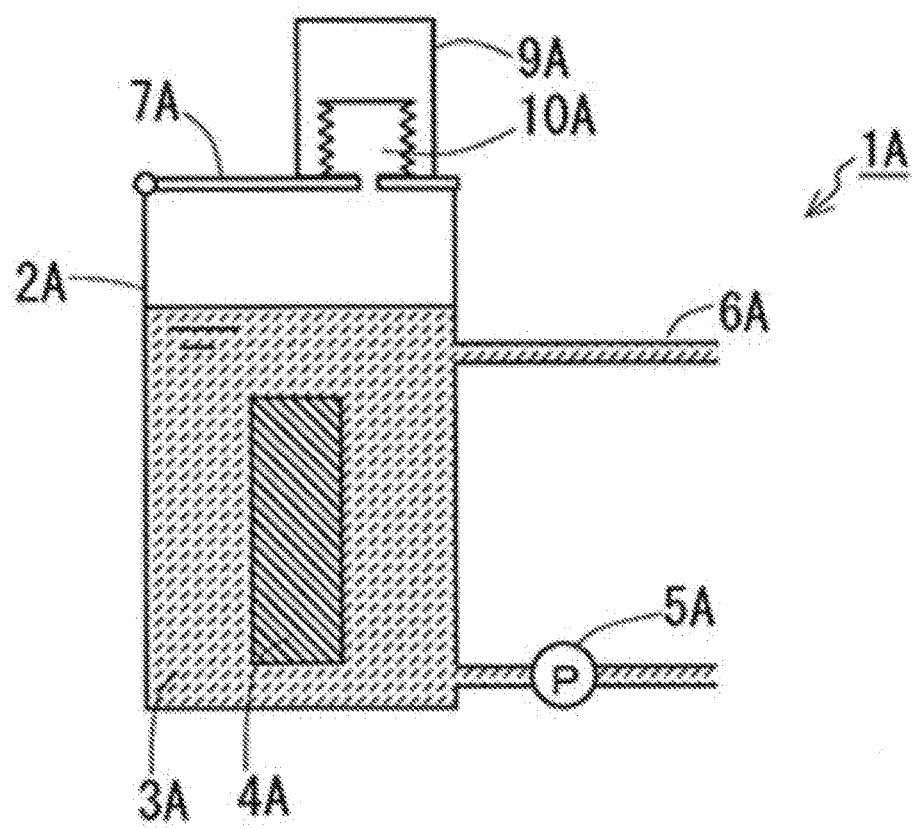
FIG. 10 illustrates an example of a liquid immersion bath.

FIG. 10 illustrates an example of a liquid immersion bath. A liquid immersion bath 1A illustrated in FIG. 3 includes the container 10A on the outer surface of the bath body 2A. In the liquid immersion bath 1A illustrated in FIG. 3, the container 10A may be disposed, for example, at an upper portion of the bath body 2A, as illustrated in FIG. 10 and the inside of the container 10A may be connected to the gas phase portion of the bath body 2A at a lower portion of the container 10A without using the tube 8A. In the liquid immersion bath 1A in which the container 10A is disposed at an upper portion of the bath body 2A and the lower portion of the container 10A is connected to the gas phase portion of the bath body 2A without using the tube 8A, when a coolant vapor in the container 10A condenses, the coolant 3A accumulated in the container 10A flows down into the bath body 2A. This configuration thus may hinder the coolant 3A from accumulating in a bottom portion of the container 10A and gas flow between the gas phase portion in the bath body 2A and the container 10A from stagnating.

Figure 11:
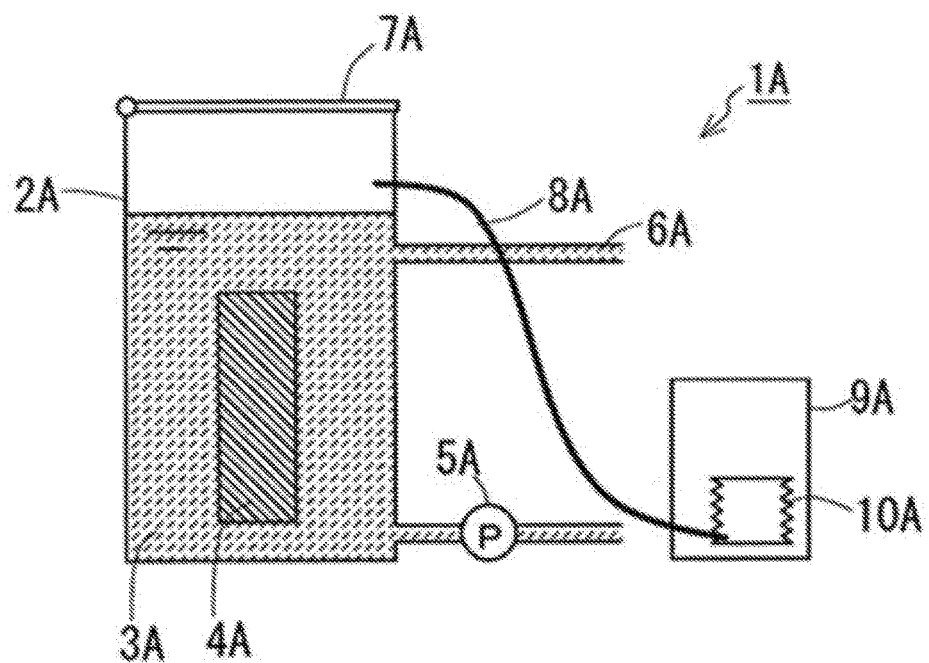
FIG. 11 illustrates an example of a liquid immersion bath.

FIG. 11 illustrates an example of a liquid immersion bath. The liquid immersion bath 1A illustrated in FIG. 1 includes the container 10A on the outer surface of the bath body 2A.

In the liquid immersion bath 1A illustrated in FIG. 1, the container 10A may be disposed, for example, at a position apart from the bath body 2A, as illustrated in FIG. 11. The liquid immersion bath 1A in which the container 10A is disposed at a position apart from the bath body 2A with the tube 8A interposed therebetween may facilitate installation of various devices or structures around the bath body 2A.

Figure 12:
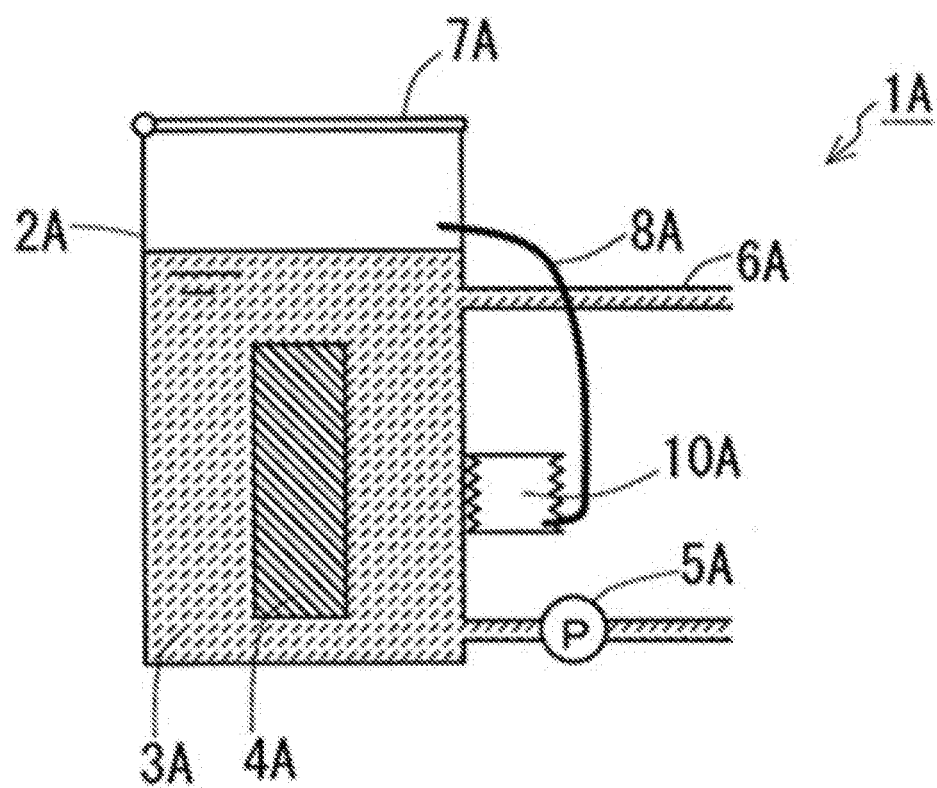
FIG. 12 illustrates an example of a liquid immersion bath.

FIG. 12 illustrates an example of a liquid immersion bath. In the liquid immersion bath 1A illustrated in FIG. 1, the container 10A is housed in the housing portion 9A. The liquid immersion bath 1A illustrated in FIG. 1 may exclude, for example, the housing portion 9A, as illustrated in FIG. 12.

Figure 13:
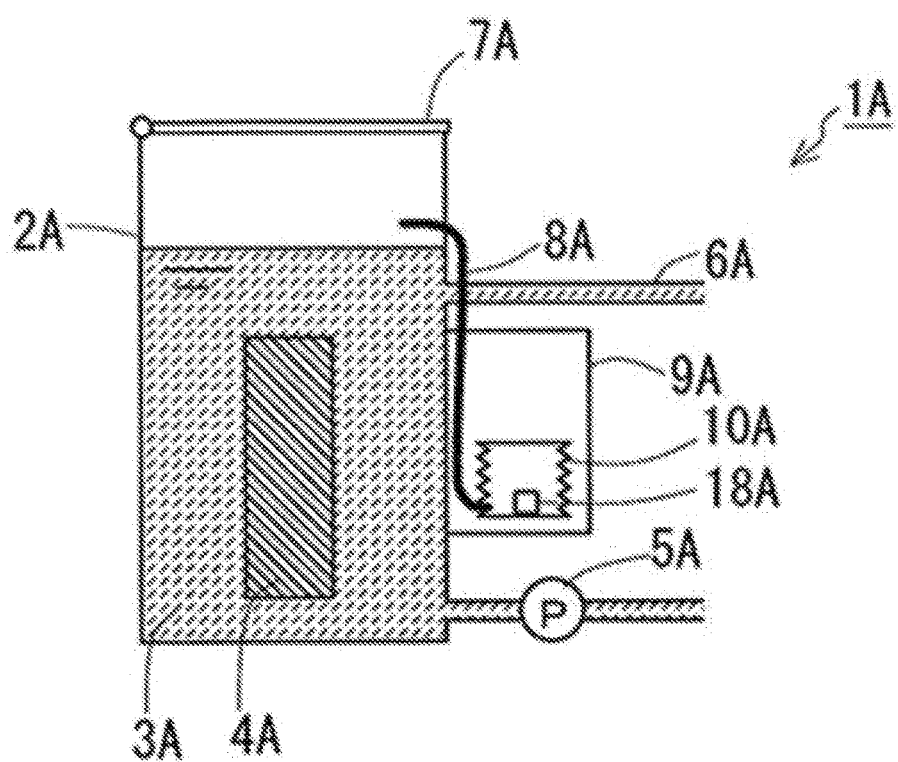
FIG. 13 illustrates an example of a liquid immersion bath.

FIG. 13 illustrates an example of a liquid immersion bath. The liquid immersion bath 1A illustrated in FIG. 1 may include, for example, a heater 18A inside the container 10A, as illustrated in FIG. 13. In the case where the heater 18A is disposed inside the container 10A, even when a coolant 3B that has evaporated inside the bath body 2A condenses in the container 10A, the coolant 3B evaporates again by being heated by the heater 18A and is returned to the bath body 2A.

Figure 14:
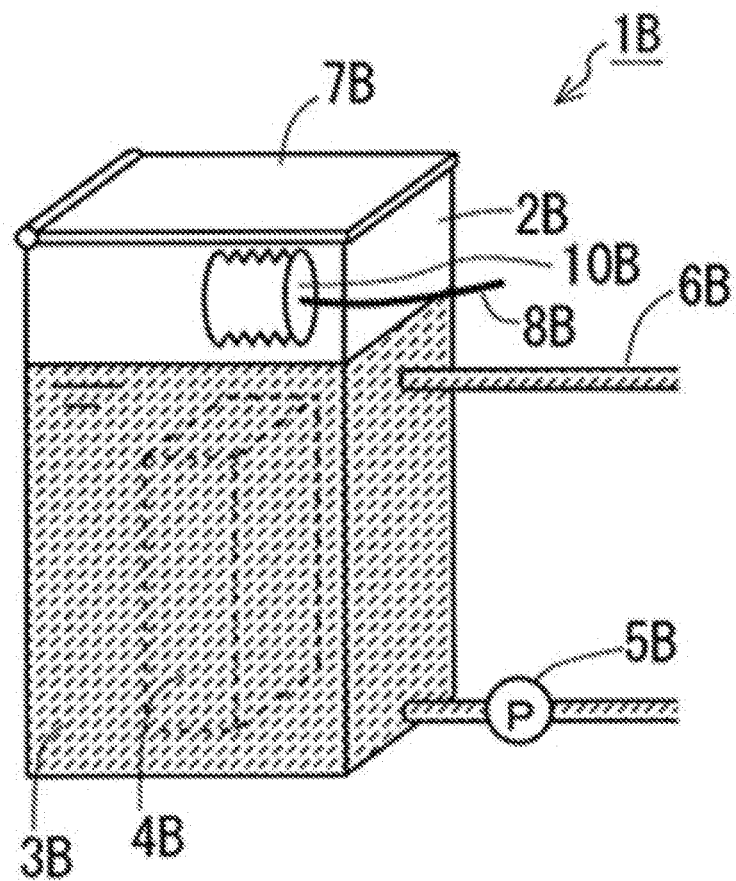
FIG. 14 illustrates an example of a liquid immersion bath for an electronic device.

FIG. 14 illustrates an example of a liquid immersion bath for an electronic device. As in the case of the liquid immersion bath 1A illustrated in FIG. 1, a liquid immersion bath 1B includes a bath body 2B that holds the coolant 3B. The bath body 2B houses an electronic device 4B. The bath body 2B is connected to a circulation path 6B equipped with a pump 5B.

The bath body 2B includes a lid 7B to facilitate maintenance of the electronic device 4B. The lid 7B is a hermetic lid capable of opening and closing the upper portion of the bath body 2B. The lid 7B is closed while the electronic device 4B is in operation. The liquid immersion bath 1B includes a container 10B, whose inside is connected to the outside of the bath body 2B, in the gas phase portion to reduce the difference in pressure between the inside and the outside of the bath body 2B caused by a change in volume of the gas in the gas phase portion and a change in volume of the coolant 3B in the liquid phase portion, which expands and contracts with the heat of the electronic device 4B.

The container 10B may be a container whose volume changes in accordance with the pressure of the gas phase portion of the bath body 2B. For example, the container 10B may be a container that includes flexible bellows capable of expanding and contracting in accordance with a fine pressure difference, a bag-shaped container formed from a flexible material, a cylindrical container in which a piston is slidable in accordance with a pressure difference, or any of other types of containers. The size of the container 10B may be appropriately determined in accordance with the assumed amount of respiration of the gas phase portion, in consideration of various factors such as the amount of the coolant 3B, the type of the coolant 3B, the amount of air or a coolant vapor in the gas phase portion of the bath body 2B, and the size of the gas phase portion of the bath body 2B.

In FIG. 14, the inside of the container 10B is connected to the outside of the bath body 2B using a flexible tube 8B. For example, the container 10B may be connected to the outside of the bath body 2B using an inflexible pipe instead of the tube 8B or the inside of the container 10B and the outside of the bath body 2B may be directly connected together.

Figure 15A:
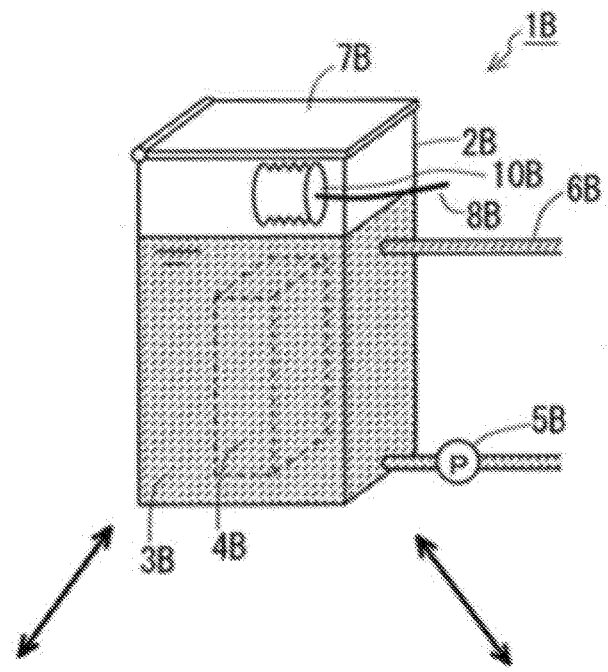
FIG. 15A to FIG. 15C illustrate an example of a container in various states.
Figure 15B:
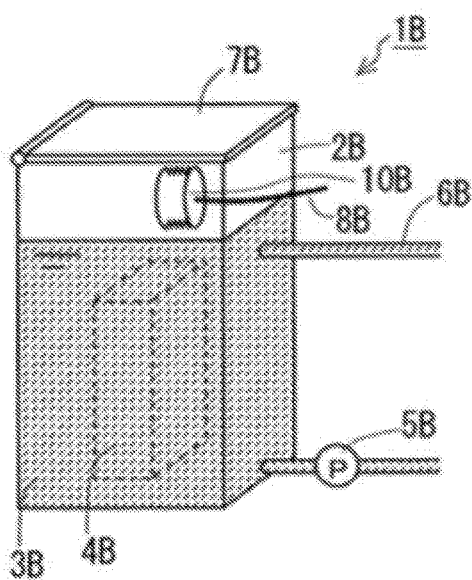
Figure 15C:
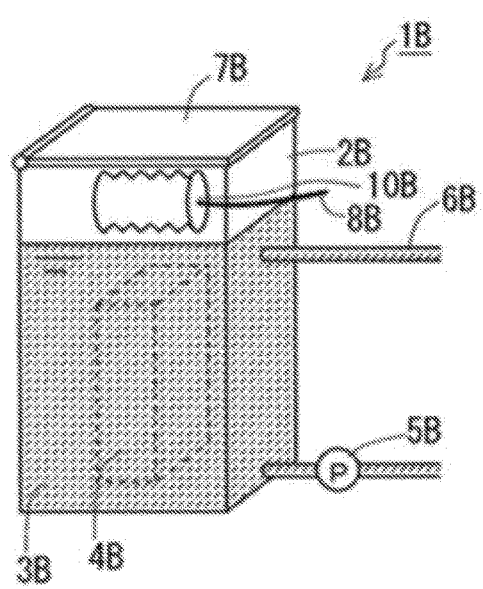

As in the case of the liquid immersion bath 1A illustrated in FIG. 1, the change of the internal pressure in the liquid immersion bath 1B illustrated in FIG. 14 may be reduced. FIG. 15A to 15C illustrate an example of a container in various states. The container 10B connected to the outside of the bath body 2B expands or contracts in accordance with the difference between the pressure in the gas phase portion of the bath body 2B and the outside air. For example, when the temperature inside the bath body 2B rises from that in the case where the container 10B is in the state of FIG. 15A due to, for example, the heat of the electronic device 4B, the volume of the gas in the gas phase portion expands, gas dissolved in the coolant 3B emerges, or the volume of the coolant 3B expands, so that gas in the gas phase portion causes the container 10B to contract, as illustrated in FIG. 15B. For example, when the temperature inside the bath body 2B falls from that in the case where the container 10B is in the state of FIG. 15A, the volume of the gas in the gas phase portion contracts, gas is dissolved into the coolant 3B, or the volume of the coolant 3B contracts, so that gas inside the gas phase portion causes the container 10B to expand, as illustrated in FIG. 15C.

As in the case of the liquid immersion bath 1A illustrated in FIG. 1, the liquid immersion bath 1B illustrated in FIG. 14 employs a liquid cooling system in which a coolant is not assumed to boil. The liquid immersion bath 1B may thus have pressure resistance not as high as the pressure resistance that the cooling system in which ebullient cooling is assumed is supposed to have.

The liquid immersion bath 1B illustrated in FIG. 14 may reduce a change of the internal pressure with a simple design. For example, the container 10B is disposed at any portion in the gas phase portion inside the bath body 2B in the liquid immersion bath 1B illustrated in FIG. 14. This configuration may thus be less likely to restrict the design of each component of the liquid immersion bath 1B, such as the position of the lid 7B.

In the liquid immersion bath 1B illustrated in FIG. 14, the container 10B is disposed inside the bath body 2B. Thus, the liquid immersion bath 1B may be smaller than the liquid immersion bath 1A illustrated in FIG. 1.

Figure 16:
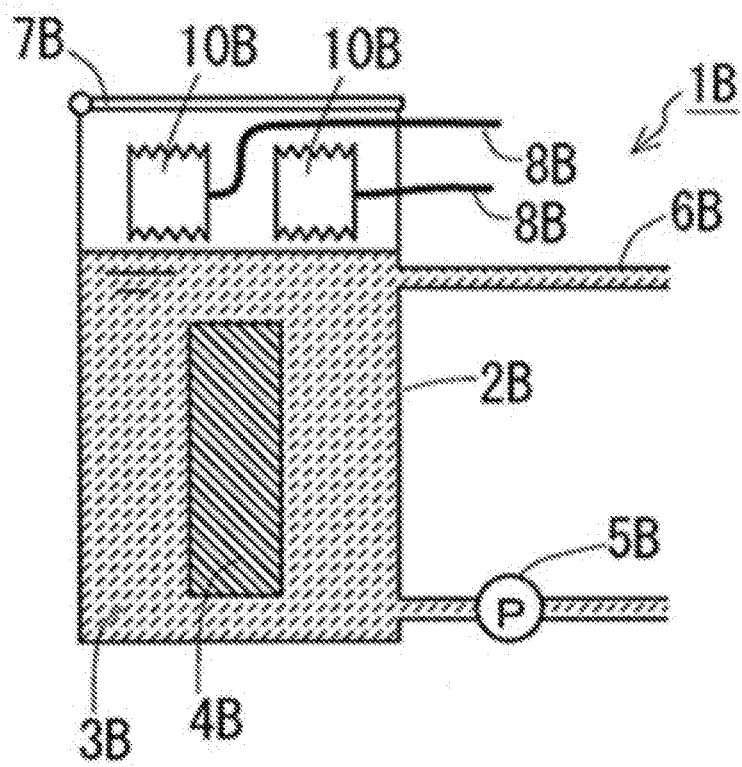
FIG. 16 illustrates an example of a liquid immersion bath.

FIG. 16 illustrates an example of a liquid immersion bath. The liquid immersion bath 1B illustrated in FIG. 14 includes one container 10B. The liquid immersion bath 1B illustrated in FIG. 14 may include, for example, multiple containers 10B, as illustrated in FIG. 16. The number of containers 10B may be appropriately determined in accordance with various factors including the size of each container 10B, the amount of the coolant 3B, the type of the coolant 3B, the amount of air or a coolant vapor in the gas phase portion of the bath body 2B, and the size of the gas phase portion of the bath body 2B.

Figure 17:
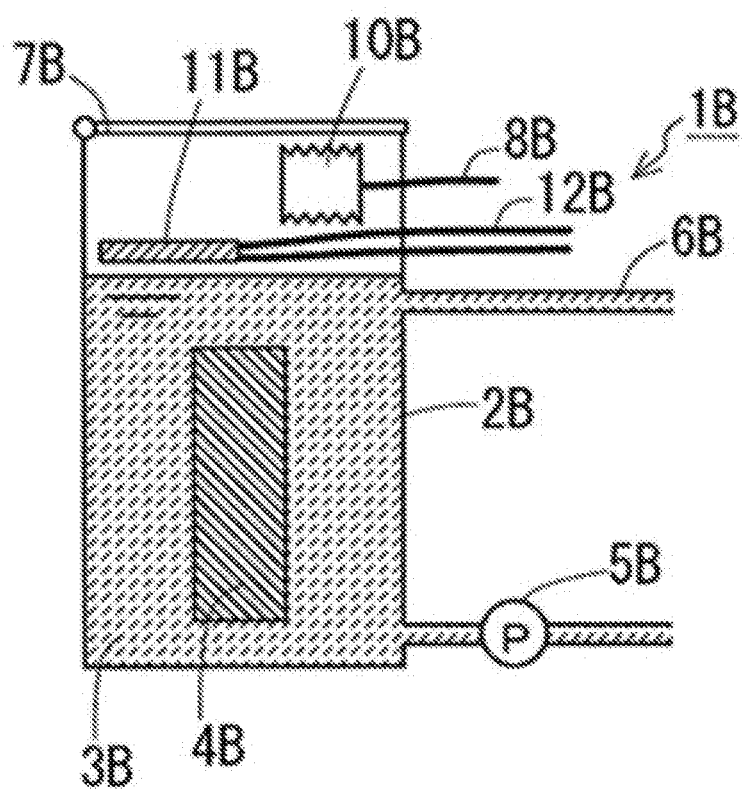
FIG. 17 illustrates an example of a liquid immersion bath.

FIG. 17 illustrates an example of a liquid immersion bath. The liquid immersion bath 1B illustrated in FIG. 14 may include, for example, a cooler 11B in the gas phase portion of the bath body 2B, as illustrated in FIG. 17. For example, a cooling pipe 12B is connected to the cooler 11B. The cooling pipe 12B allows cooling water cooled by a refrigerator, cooling water cooled by a cooling tower, or cooling water of various other types to flow therethrough. When the cooler 11B is disposed in the gas phase portion of the bath body 2B, for example, a coolant that has evaporated with the heat of the electronic device 4B may condense. When the coolant that has evaporated in the gas phase portion of the bath body 2B condenses, the amount of gas in the gas phase portion decreases, so that the rise of the internal pressure of the bath body 2B may be reduced.

Figure 18:
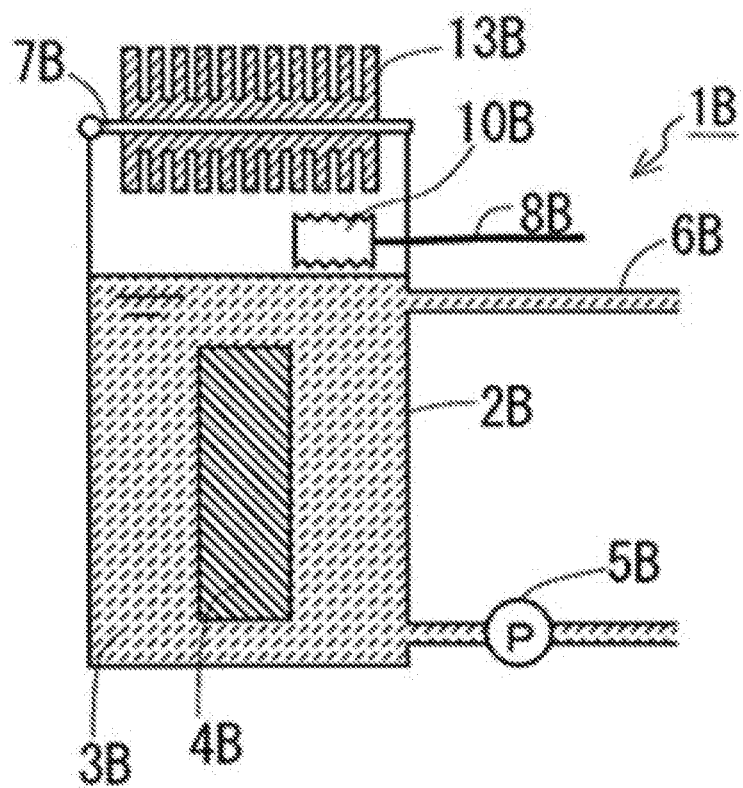
FIG. 18 illustrates an example of a liquid immersion bath.

FIG. 18 illustrates an example of a liquid immersion bath. The liquid immersion bath 1B illustrated in FIG. 14 may include, for example, a radiator 13B, which exchanges heat between the inside and the outside of the bath body 2B, at an upper portion of the bath body 2B, as illustrated in FIG.

18. When the radiator 13B is disposed at an upper portion of the bath body 2B, for example, the coolant that has evaporated with the heat of the electronic device 4B condenses. When the coolant that has evaporated in the gas phase portion of the bath body 2B condenses, the amount of gas in the gas phase portion decreases, so that the rise of the internal pressure of the bath body 2B may be reduced.

Figure 19:
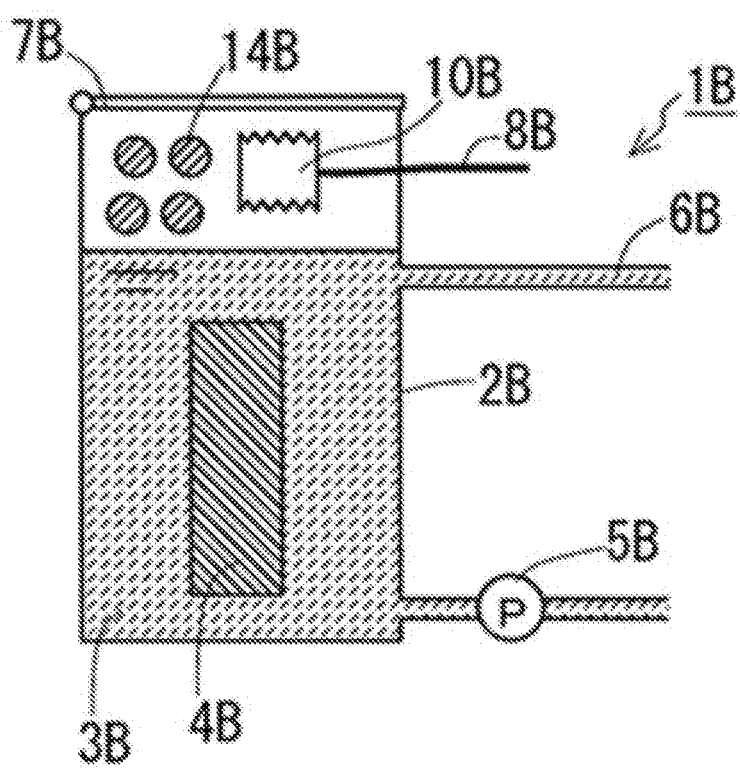
FIG. 19 illustrates an example of a liquid immersion bath.

FIG. 19 illustrates an example of a liquid immersion bath. The liquid immersion bath 1B illustrated in FIG. 14 may include, for example, various objects 14B, which substantially reduce the capacity of the gas phase portion, in the gas phase portion of the bath body 2B, as illustrated in FIG. 19. When the capacity of the gas phase portion of the bath body 2B is reduced by the various objects 14B, the amount by which gas in the gas phase portion expands with heat decreases. The size of the container 10B may thus be reduced.

Figure 20:
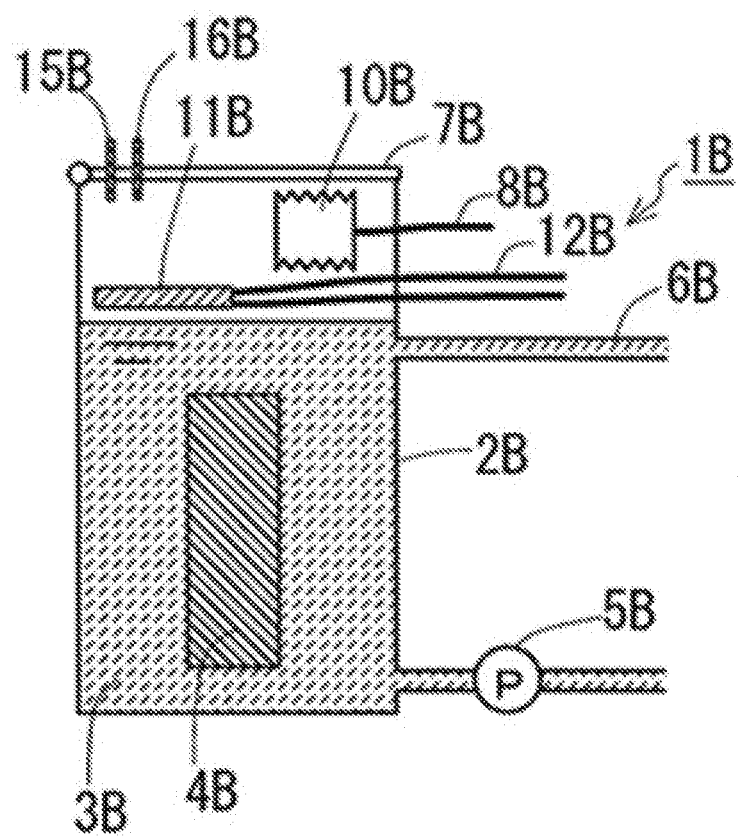
FIG. 20 illustrates an example of a liquid immersion bath.

FIG. 20 illustrates an example of a liquid immersion bath. The liquid immersion bath 1B illustrated in FIG. 14 may include, for example, besides the cooler 11B illustrated in FIG. 17, a thermometer 15B, which measures the temperature of the gas phase portion of the bath body 2B, and a pressure gauge 16B, which measures the pressure of the gas phase portion of the bath body 2B. A cooling pipe 12B, through which cooling water whose temperature has been adjusted in accordance with the temperature measured by the thermometer 15B or the pressure measured by the pressure gauge 16B flows, is connected to the cooler 11B. The temperature of cooling water that flows through the cooler 11B is adjusted in accordance with the temperature measured by the thermometer 15B or the pressure measured by the pressure gauge 16B. Thus, the amount by which the coolant that has evaporated in the gas phase portion condenses is adjusted, so that the internal pressure of the bath body 2B may be adjusted to fall within an appropriate range.

Figure 21:
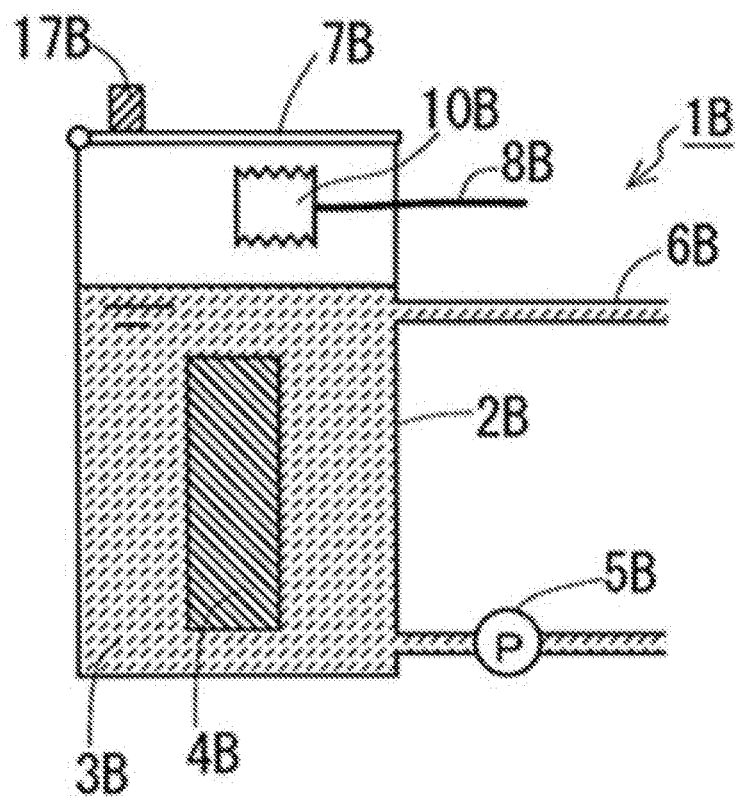
FIG. 21 illustrates an example of a liquid immersion bath.

FIG. 21 illustrates an example of a liquid immersion bath. The liquid immersion bath 1B illustrated in FIG. 14 may include, for example, a pressure regulating valve 17B, which opens when the pressure of the gas phase portion of the bath body 2B arrives at a predetermined pressure, as illustrated in FIG. 21. The pressure at which the pressure regulating valve 17B opens may be lower than a lower one of the resistible pressure of the bath body 2B and the resistible pressure of the container 10B. In the case where, for example, the liquid immersion bath 1B includes the pressure regulating valve 17B that functions as a safety valve, the pressure regulating valve 17B opens, for example, when the pressure of the gas phase portion of the bath body 2B is to rise beyond the limit of the pressure range within which the container 10B is capable of contracting. Thus, the bath body 2B or the container 10B may be less likely to be broken.

Figure 22:
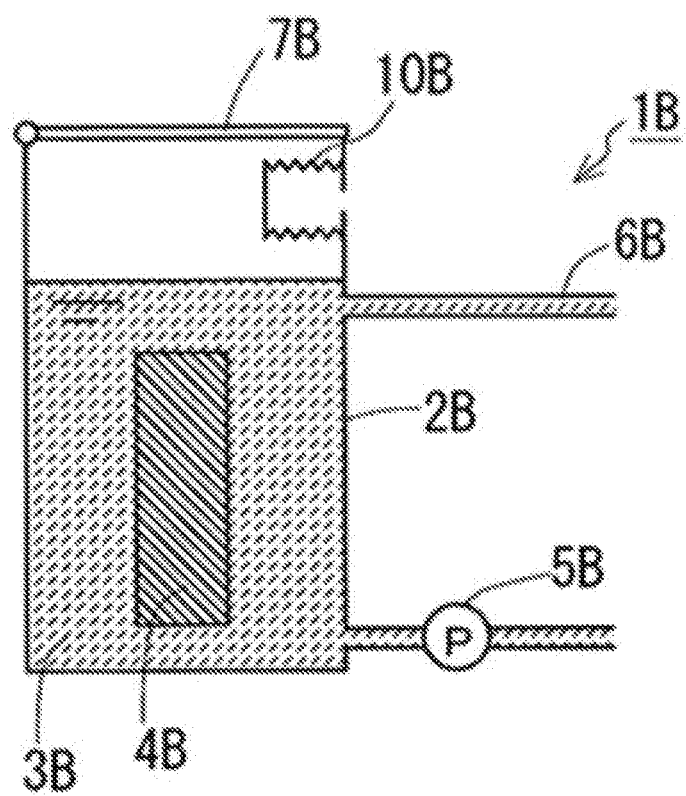
FIG. 22 illustrates an example of a liquid immersion bath.

FIG. 22 illustrates an example of a liquid immersion bath. The liquid immersion bath 1B illustrated in FIG. 14 includes the container 10B at a position apart from the inner surface of the bath body 2B. In the liquid immersion bath 1B illustrated in FIG. 14, the container 10B may be disposed, for example, on the inner surface of the bath body 2B, as illustrated in FIG. 22 and the inside of the container 10B and the outside of the bath body 2B may be connected together without using the tube 8B.

The embodiments described above may be appropriately combined one with another.

Now, results obtained after the examination of the liquid immersion bath 1B illustrated in FIG. 14 are described below.

In the examination, two types of bath bodies each having inner dimensions of a width of 1.0 m, a length of 1.0 m, and a depth of 1.0 m were prepared and a coolant was poured up to a level of 0.7 m. One of the prepared two types of bath bodies has a form modeled on the liquid immersion bath 1B illustrated in FIG. 14 and in which a container corresponding to the container 10B is placed (this configuration is referred to as "a first example", below). The other one of the prepared two types of bath bodies does not have a container corresponding to the container 10B and is formed as a sealed bath body (this configuration is referred to as "a second example", below).

In either the first example or the second example, the following case is assumed: the lid is closed when the temperature inside the bath is 20° C. and the internal pressure is 100 kPa (absolute pressure) and then the temperature inside the bath rises up to 70° C. Here, the emergence of air dissolved in the coolant may be ignored. In the case of the second example, the internal pressure theoretically rises up to 144 kPa. Thus, the liquid immersion bath has to have high pressure resistance. In the case of the first example, the internal pressure is kept at 100 kPa (absolute pressure), which is substantially the same as the atmospheric pressure.

In an experiment using "Novec 7200", which is a product from 3M, Novec 7200 was poured into a bath body having an opening area of 177 cm$^2$ and left indoors at a maximum temperature of approximately 20° C. Here, it evaporated at a rate of approximately 0.0121 g/cm$^2$h. In the state where a coolant is poured in a bath body having inner dimensions of a width of 1.0 m, a length of 1.0 m, and a depth of 1.0 m up to a level of 0.7 m and an upper portion of the bath body is left open, approximately 540 kg of the coolant is assumed to evaporate within half a year. When the coolant is heated and has a higher temperature, the amount of the coolant that evaporates is assumed to increase further. The configuration in which, for example, the bath body is sealed may be free from the effect of evaporation.

Results of a comparative study between the liquid immersion bath 1A illustrated in FIG. 1 and the liquid immersion bath 1B illustrated in FIG. 14 are described below. For example, the following case is assumed: a coolant is poured in a bath body having inner dimensions of a width of 1.0 m, a length of 1.0 m, and a depth of 1.0 m up to a level of 0.7 m and the lid is closed when the temperature inside the bath is 20° C. and the internal pressure is 100 kPa (absolute pressure) and then the temperature inside the bath rises up to 70° C. Here, the emergence of air dissolved in the coolant may be ignored. In this case, the capacity of the container that has to keep the internal pressure at 100 kPa is 0.120 m$^3$ when the container is an internal type corresponding to the container 10B of the liquid immersion bath 1B illustrated in FIG. 14 and the capacity is 0.131 m$^3$ when the container is an external type corresponding to the container 10A of the liquid immersion bath 1A illustrated in FIG. 1. This study reveals that an internal-type container has a size smaller by 0.011 m$^3$ than that of an external-type container and the internal-type container may save a space by 0.131 m$^3$ on the outer side of the bath body.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid immersion bath for an electronic device comprising:
   a bath body that is capable of housing the electronic device, is coupled to a circulation path through which a liquid coolant which cools the electronic device immersed in the liquid coolant circulates, and includes a gas phase portion corresponding to a space free from the liquid coolant; and
   a container that is disposed in the gas phase portion which is disposed between a lid of the bath body and a surface of liquid coolant and has a volume which changes in accordance with a pressure of the gas phase portion,
   an inside of the container is coupled to an outside of the bath body.

2. The liquid immersion bath according to claim 1, wherein the container is disposed adjacent to an inner surface of the bath body.

3. The liquid immersion bath according to claim 1, wherein the container is coupled to the outside of the bath body using a tube.

4. The liquid immersion bath according to claim 1, wherein the lid is provided at an upper portion of the bath body.

5. The liquid immersion bath according to claim 1, wherein the bath body includes a cooler through which cooling water flows in the gas phase portion.

6. The liquid immersion bath according to claim 1, wherein the bath body includes a radiator that is provided at an upper portion of the bath body and transfers heat of the inside of the bath body to the outside of the bath body.

7. The liquid immersion bath according to claim 1, wherein the bath body includes a pressure regulating valve that opens when the pressure of the gas phase portion reaches a given pressure.

8. A liquid immersion bath for an electronic device comprising:
   a bath body that is capable of housing the electronic device, is coupled to a circulation path through which a liquid coolant which cools the electronic device immersed in the liquid coolant circulates and includes a gas phase portion corresponding to a space free from the liquid coolant;
   a container that is disposed outside the bath body and has a capacity which changes in accordance with a pressure of the gas phase portion, an inside of the container is coupled to the gas phase portion; and
   a heater that heats the inside of the container.

9. The liquid immersion bath according to claim 8, wherein the container is disposed at a position higher than a liquid level of the coolant in the bath body.

10. The liquid immersion bath according to claim 8, wherein the container is disposed at an upper portion of the bath body and the inside of the container is coupled to the gas phase portion at a lower portion of the container.

11. The liquid immersion bath according to claim 8, wherein the container is coupled to the gas phase portion using a tube.

12. The liquid immersion bath according to claim 8, wherein the bath body includes a lid at an upper portion.

13. The liquid immersion bath according to claim 8, wherein the bath body includes a cooler through which cooling water flows in the gas phase portion.

14. The liquid immersion bath according to claim 8, wherein the bath body includes a radiator that is provided at an upper portion of the bath body and transfers heat of the inside of the bath body to the outside of the bath body.

15. The liquid immersion bath according to claim 8, wherein the bath body includes a pressure regulating valve that opens when the pressure of the gas phase portion reaches a given pressure.

16. A liquid immersion bath for an electronic device comprising:
   a bath body that is capable of housing the electronic device, is coupled to a circulation path through which a liquid coolant which cools the electronic device immersed in the liquid coolant circulates, and includes a gas phase portion corresponding to a space free from the liquid coolant; and
   a container that is disposed in the gas phase portion and has a volume which changes in accordance with a pressure of the gas phase portion,
   an inside of the container is coupled to an outside of the bath body,
   the bath body includes a pressure regulating valve that opens when the pressure of the gas phase portion reaches a given pressure.

* * * * *